United States Patent [19]

Germer et al.

[11] Patent Number: 4,620,150

[45] Date of Patent: Oct. 28, 1986

[54] ELECTRIC METER WITH ELECTRONIC ROLLING DEMAND REGISTER

[75] Inventors: Warren R. Germer, Dover; Richard A. Balch, Rochester, both of N.H.

[73] Assignee: General Electric Company, Somersworth, N.H.

[21] Appl. No.: 599,742

[22] Filed: Apr. 12, 1984

[51] Int. Cl.$^4$ .................... G01R 19/16; G01R 11/64; G01R 1/40

[52] U.S. Cl. ................................. 324/103 R; 324/116

[58] Field of Search .................. 324/73 R, 103 R, 74, 324/116; 364/483, 492; 307/39, 29; 340/637, 664

[56] References Cited

U.S. PATENT DOCUMENTS 4,509,128 4/1985 Coppola et al. .................... 364/485

FOREIGN PATENT DOCUMENTS 0047703 3/1977 Japan .................................. 340/637

*Primary Examiner*—Ernest F. Karlsen
*Assistant Examiner*—Vinh Phu Nguyen
*Attorney, Agent, or Firm*—Robert E. Brunson; Thomas R. Morrison

[57] ABSTRACT

An electronic demand register divides a demand interval into a contiguous set of N demand subintervals. The demand in each demand subinterval is summed with the demands from the N−1 most recent contiguous demand subintervals to derive the interval demand. The interval demand is compared with a prior stored maximum demand to decide whether to discard the present interval demand or to use it to replace the previously recorded maximum demand. Demand is accumulated in terms of actual power usage by scaling power usage pulses according to the relationship in the particular meter on which the rolling demand register is used. Thresholds are provided for producing warning signals to alert the consumer to an actual or impending demand condition which may adversely affect billing.

9 Claims, 10 Drawing Figures

ELECTRIC METER WITH ELECTRONIC ROLLING DEMAND REGISTER

BACKGROUND OF THE INVENTION

The present invention relates to electric meters and, more particularly, to apparatus and method for accumulating demand in an electronic demand register of an electric meter.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

Maximum demand is conventionally defined as the maximum amount of power consumed in any one contiguous time interval during the time period of interest; that is, the maximum amount of power consumed in any one of the intervals of, for example, 15 minutes, 30 minutes or one hour over a time period. The time period may, for example, coincide with the time between readings of the meter. From the standpoint of the utility providing the power, the capital investment required for power generation equipment is determined by the amount of equipment required to supply the peak, or maximum, amount of power which may be demanded by all of its users. It has been widely observed that system-wide power usage varies widely with time of day and with season of year. In order to meet the average, or base level, of power usage, a utility can provide a large, efficient, base load generator which may be, for example, a hydroelectric or steam turbine-generator. Such base load generators are typically maintained in continuous service for many years without being either shut down or totally unloaded. In such continuous service, base load generators provide high thermodynamic efficiency. To supply the peak loads, a utility is required to bring on line generating equipment having lower thermodynamic efficiency. Thus, not only does the capital cost for power generation increase when a high peak load to base load ratio exists, but also, the operating costs for such peak-load generating equipment is higher than that for base-load generating equipment.

The system load imposed on a utility is, in the end, determined by the energy consumers. If the energy consumers can be convinced to reduce the peaks in their individual energy consumption, the peaks in system load will also be attenuated. Demand metering has been introduced to give the energy consumers an economic incentive to reduce the peaks in their energy consumption. This is accomplished by keeping track of the amount of energy used in each of a series of demand intervals and storing the maximum value of demand measured in any one of the demand intervals. The measured maximum demand is then used to modify the consumer's billing so that the bills are lower if the maximum demand is lower and are higher if the maximum demand is higher. This method of modifying consumer billing on the basis of the maximum demand has been accepted by many of the governmental utility commissions which oversee billing practices.

One type of electric meter containing a mechanical demand register is disclosed in U.S. Pat. No. 3,586,974. The mechanical demand register records the power usage in each of a contiguous series of demand intevals. A demand interval may be, for example, a predetermined fraction of an hour, the demand register stores the maximum value occurring during any one of the demand intervals for reading at the end of a predetermined period of time. The predetermined period of time may be, for example, the time between meter readings, or a period of time corresponding to the billing period of the utility providing the power. A clockwork mechanism restarts the demand register at the end of each demand interval so that, when the stored value is read, the stored value represents the highest value of power usage occurring during any one of the demand intervals since the demand register was last reset.

Demand registers of the mechanical type, such as disclosed in the above U.S. Patent, have limited flexibility. Once their design is completed for a particular meter physical configuration, the design is not transferrable to a meter having a different physical configuration. Also, the demand-measurement functions cannot be redefined without major mechanical redesign.

Greater flexibility in demand metering may be obtainable using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the demand during defined periods of time.

It has been observed that the maximum demand recorded by such a demand register may vary substantially depending on the size of the demand interval. An excessively lengthy demand interval, for example, tends to average out the peaks in maximum demand to the point that demand metering becomes less meaningful. A too short demand interval can make the demand register almost solely responsive to transients such as occasioned, for example, by motor starting loads.

The recorded maximum demand can also be affected by the accidental positioning of demand peaks and valleys either entirely within a demand interval or bridging two demand intervals. That is, if a single large peak should occur entirely within a demand interval, such a single large peak may raise the total power usage in the demand interval to a value which becomes recorded as the maximum demand and therefore affects the consumer billing. Conversely, if such a single large peak should fortuitously bridge the end of one demand interval and the beginning of the next demand interval, its effect may be split between the two demand intervals in a manner which may so dilute the effect of the peak that neither demand interval may accumulate a usage which exceeds the previously recorded maximum demand. In this latter case, the consumer's billing is not affected in the same way by the peak.

OBJECTS AND SUMMARY OF THE INVENTION

Accordingly, it is an object of the invention to provide a technique for demand metering which provides substantial sensitivity to peak demands and substantial insensitivity to fortuitous positioning of peaks with respect to the transition between demand intervals.

It is a further object of the invention to provide an electronic demand register having apparatus and method for rolling demand metering.

It is a further object of the invention to provide an electronic rolling demand register in which a demand interval is divided into N equal demand subintervals. At the end of each subinterval, the demand from the just-finished subinterval is summed with the demands from the prior $N-1$ subintervals to derive the interval demand.

It is a further object of the invention to scale power usage pulses to produce a power usage signal which is directly related to actual kilowatts of power usage and to employ this power usage signal in the calculation of demand.

It is a still further object of the invention to provide a rolling demand register which includes means for producing an alarm signal when the recorded demand attains a predetermined alarm level.

Briefly stated, the present invention provides an electronic demand register which divides a demand interval into a contiguous set of N demand subintervals. The demand in each demand subinterval is summed with the demands from the $N-1$ most recent contiguous demand subintervals to derive the interval demand. The interval demand is compared with a prior stored maximum demand to decide whether to discard the present interval demand or to use it to replace the previously recorded maximum demand. Demand is accumulated in terms of actual power usage by scaling power usage pulses according to the relationship in the particular meter on which the demand register is used. Thresholds are provided for producing warning signals to alert the consumer to an actual, or impending, demand condition which may adversely affect billing.

According to an embodiment of the invention, there is provided an electronic demand register for an electric meter comprising means for defining a demand subinterval, means for defining a demand interval equal to an intergal number N of the demand subintervals, means for summing a power usage data during each demand subinterval with a sum of demand data from $N-1$ prior demand subintervals to derive a rolling interval demand, means for storing a maximum demand, means for comparing the rolling interval demand with the maximum demand and means for replacing the maximum demand with the rolling interval demand if the rolling interval demand exceeds the maximum demand whereby the means for storing a maximum demand remains updated with a maximum rolling interval demand in any preceding demand interval.

According to a feature of the invention, there is provided a method for registering a demand for an electric meter comprising defining a demand subinterval, defining a demand interval equal to an integral number N of the demand subintervals, summing a power usage data during each demand subinterval with a sum of demand data from $N-1$ prior demand subintervals to derive a rolling interval demand, storing a maximum demand, comparing the rolling interval demand with the maximum demand and replacing the maximum demand with the rolling interval demand if the rolling interval demand exceeds the maximum demand whereby the maximum demand remains updated with a maximum rolling interval demand in any preceding demand interval.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption including, for example, single phase or polyphase meters with one or more current and voltage coils, for concreteness, the detailed description which follows is directed toward an illustrative example of a 2-wire single phase meter of the type having a single current coil and a single voltage coil.

Figure 1:
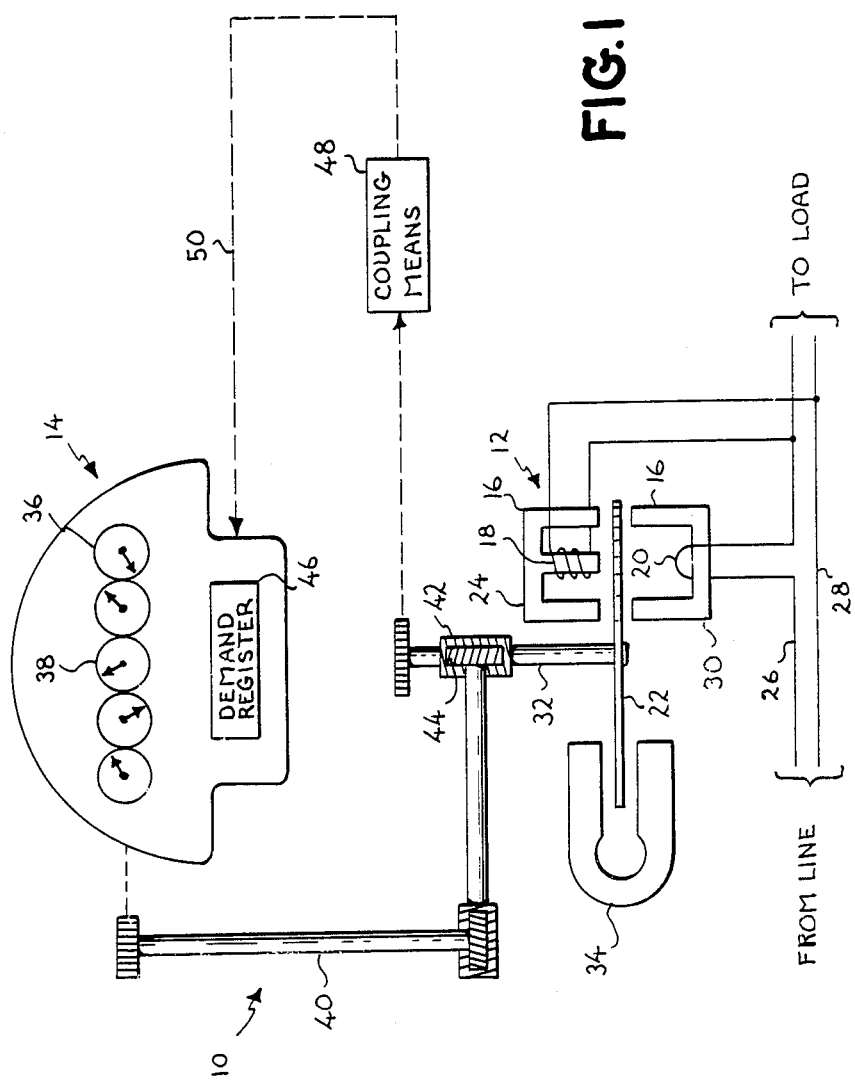
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically two or more, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current; that is, the power consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, engaging and rotating a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials, or indicating devices, in the mechanical embodiment of demand register 46 are urged forward for a fixed demand interval by a pusher mechanism (not shown). The pusher mechanism is reset and restarted at the end of each of the demand intervals, leaving the indicating devices with an indication proportional to the power usage (the demand) during the demand interval. The indication on the indicating devices at any time is, therefore, the highest demand which has occurred during any one of the demand intervals since the last time the indicating devices were reset. The recorded demand is employed in billing.

Figure 2:
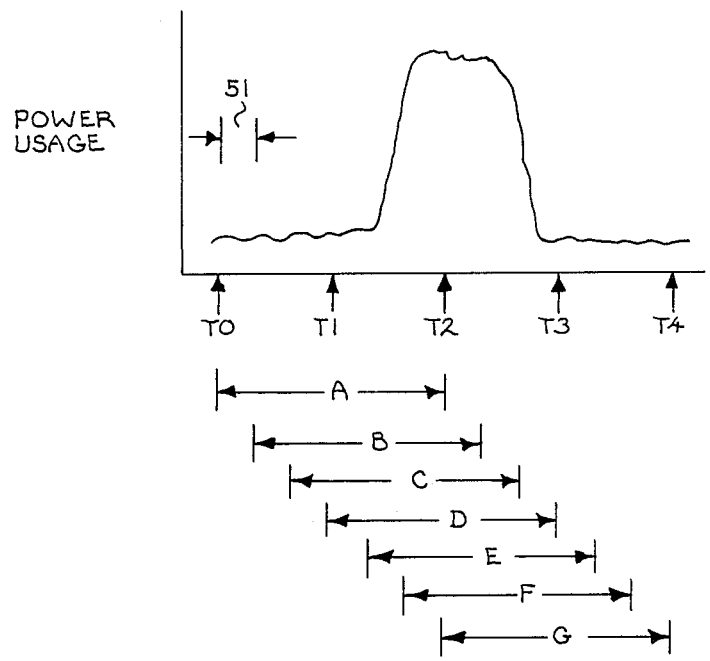
FIG. 2 is a curve of power usage versus time to which reference will be made in describing demand metering according to the prior art and in accordance with an embodiment of the invention.

Referring now to FIG. 2 and FIGS. 3A-3C, the drawbacks of a mechanical demand register are illustrated. In FIG. 2, four equal time periods, T0-T1, T1-T2, T2-T3 and T3-T4, are illustrated. For purposes of explanation, a large peak in power usage is shown to occur bridging the time periods T1-T2 and T2-T3 with much lower power usage preceding and following the peak. If a demand interval is defined as a contiguous pair of the above time periods, the particular pairs of time periods representing the demand intervals have a substantial bearing on the demand recorded by the mechanical demand register. It should be borne in mind that the positioning of a peak with respect to the boundaries of demand intervals is completely fortuitous.

Figure 3A:
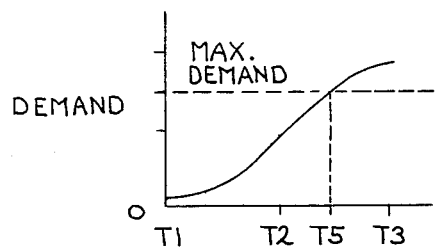
FIGS. 3A-3C are demand curves taken from the power usage curve of FIG. 2 based on different assumptions regarding the time relationships of a peak usage and a demand interval.
Figure 3B:
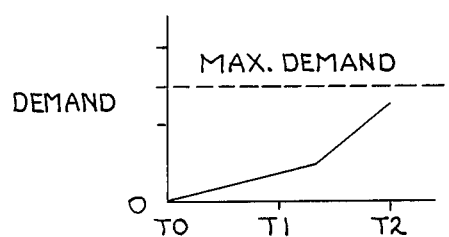
Figure 3C:
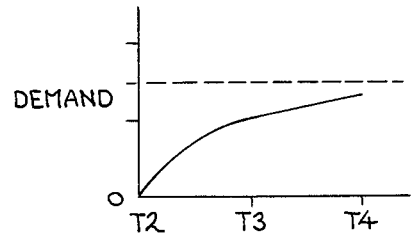

If time periods T1-T3 represent a demand interval, the peak in power usage falls completely within this single demand interval and a demand, such as shown in FIG. 3A, is recorded. It will be noted that the demand exceeds a previously recorded maximum demand, indicated by a dashed line, and thus may affect billing. Conversely, if time T2, instead of falling in the center of a demand interval represents the end of a first demand interval T0-T2 and the beginning of the next demand interval T2-T4, the single large peak of FIG. 2 is split between the two demand intervals with the recorded demands shown in FIGS. 3B and 3C. Due to the fact that the peak is averaged with lower demand in the remainder of the two demand intervals, the recorded demand remains below the previously recorded maximum demand and billing remains unaffected by the peak. Since the peak represents an actual economic burden on the utility, the utility is entitled to modify the billing accordingly without being denied this opportunity because of a fortuitous positioning of the peak bridging the transition from one demand interval to the next.

The concept of rolling demand metering is invoked to ensure that actual peaks in demand are recognized without requiring an unrealistically short demand interval. A demand interval is divided into N equal contiguous demand subintervals 51. The demand in each demand subinterval 51 is recorded. At the end of each demand subinterval 51, the demand recorded for demand subinterval 51 is added to the demand recorded in the preceding N−1 demand subintervals 51 to yield the demand in the N subintervals making up the rolling demand interval. In an example case illustrated in FIG. 2, a demand interval is divided into six equal demand subintervals 51. Thus, at time T2, the demand in demand interval A from T0 to T2 is calculated and compared to the recorded maximum demand. The demand thus calculated corresponds exactly to the demand shown in FIG. 3B. The calculation of demand continues at the completion of each of rolling demand intervals B-G in FIG. 2. In particular, rolling demand interval D corresponds to the time period T1 to T3 within which the entire peak usage occurs. Thus rolling demand interval D produces the same result as shown in FIG. 3A. It will be recognized that rolling demand interval G corresponds to the demand in time period T2-T4 shown in FIG. 3C. In this way, the effect of a peak demand is appropriately detected and recorded without permitting its effect to be attenuated as an artifact of the manner in which demand intervals relate in time to the occurrence of the peak.

In the present invention, demand register 46 is an electronic demand register in which rolling demand metering, as outlined above, is performed.

Figure 4:
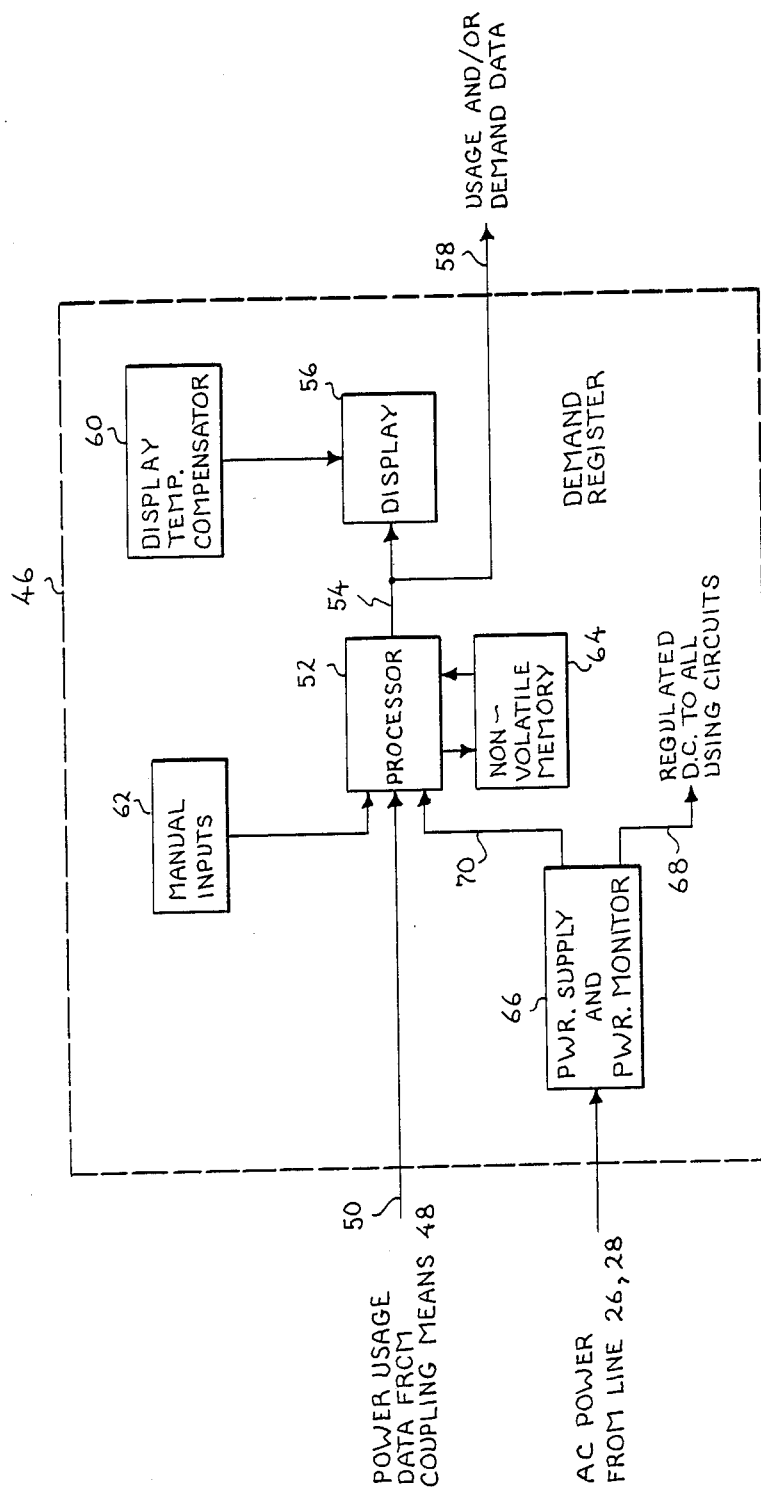
FIG. 4 is a block diagram of a demand register of FIG. 1 according to an embodiment of the invention.

Referring to FIG. 4, there is shown a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency or pulse repetition rate, which is variable in dependence on the rate of power usage. Any suitable electronic signal generating apparatus, such as, for example, an apparatus such as one of those disclosed in the referenced prior patents, may be employed to produce a power usage signal which is applied on a line 50 to a processor 52 in demand register 46. Processor 52 appropriately performs calculations on the usage data, such as, for example, counting pulses and scaling, to derive desired demand parameters and stores the result. In addition, processor 52 may provide an output on a line 54 suitable for driving a display 56. The stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and function are not of interest to the present disclosure.

A manual input 62 is provided for resetting appropriate portions of the data stored in processor 52 and for modifying the displayed data for purposes of aiding the reading of, for example, demand and other data from display 56, as will be explained.

As previously noted, processor 52 conventionally employs volatile random access memory elements which lose any data stored in them in the event of a power outage. This is usually not acceptable in an electric meter where such loss of usuage and/or demand data has a negative financial impact on the utility supplying the electric power. Non-volatile storage elements such as, for example, electrically erasable programmable read only memory elements, are well known for use with processor 52. However, such non-volatile storage elements normally have relatively slow memory erase and write times on the order of 10 or 20 milliseconds. This is too slow for most applications. Besides this drawback, the power required to write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. The volatile memory elements in processor 52 must, of course, be written and erased many thousands of times a day. Thus, an electrically erasable programmable read only memory would have a very short life as the operating memory for processor 52.

In order to provide safe storage for data and/or programmed constants during a power outage or during test operation, a conventional non-volatile memory 64 is provided into which such data and constants can be written and from which the data and constants can again be read upon restoration of normal conditions. In their role in non-volatile memory 64, electrically erasable programmable read only memory elements are erased and rewritten only when a relatively serious threat of a power outage occurs and possibly during a relatively small number of test cycles. Such operations are not expected to occur on a frequent enough basis in demand register 46 of electric meter 10 to represent a limit on the life of the register.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to detected conditions indicating the possibility an impending power outage or the actuality of such a power outage, applies an emergency store signal on a line 70 to processor 52 which controls the transfer of data from processor 52 to non-volatile memory 64 in the event of an apparent power outage and resets processor 52 in the event of an actual power outage. Prior to transferring the data and programmed constants to non-volatile memory 64, processor 52 checks to determine whether the demand during the current interval up to the time of the power outage exceeds the maximum demand previously recorded. If the demand in the current interval does exceed the maximum demand, the demand for the current interval is substituted for the maximum demand and the thus-modified data is transmitted to non-volatile memory 64 for storage. Upon restoraton of power, power supply and power monitor 66 applies a reset signal on line 70 to processor 52 for initiating the sequence for resuming demand metering. A full disclosure of the structure and function of power supply and power monitor 66 is contained in U.S. patent application Ser. No. 599,736 and a full disclosure of the sequence for resumption of demand metering following a power outage is contained in U.S. patent application Ser. No. 599,743 which are herein incorporated by reference.

Figure 5:
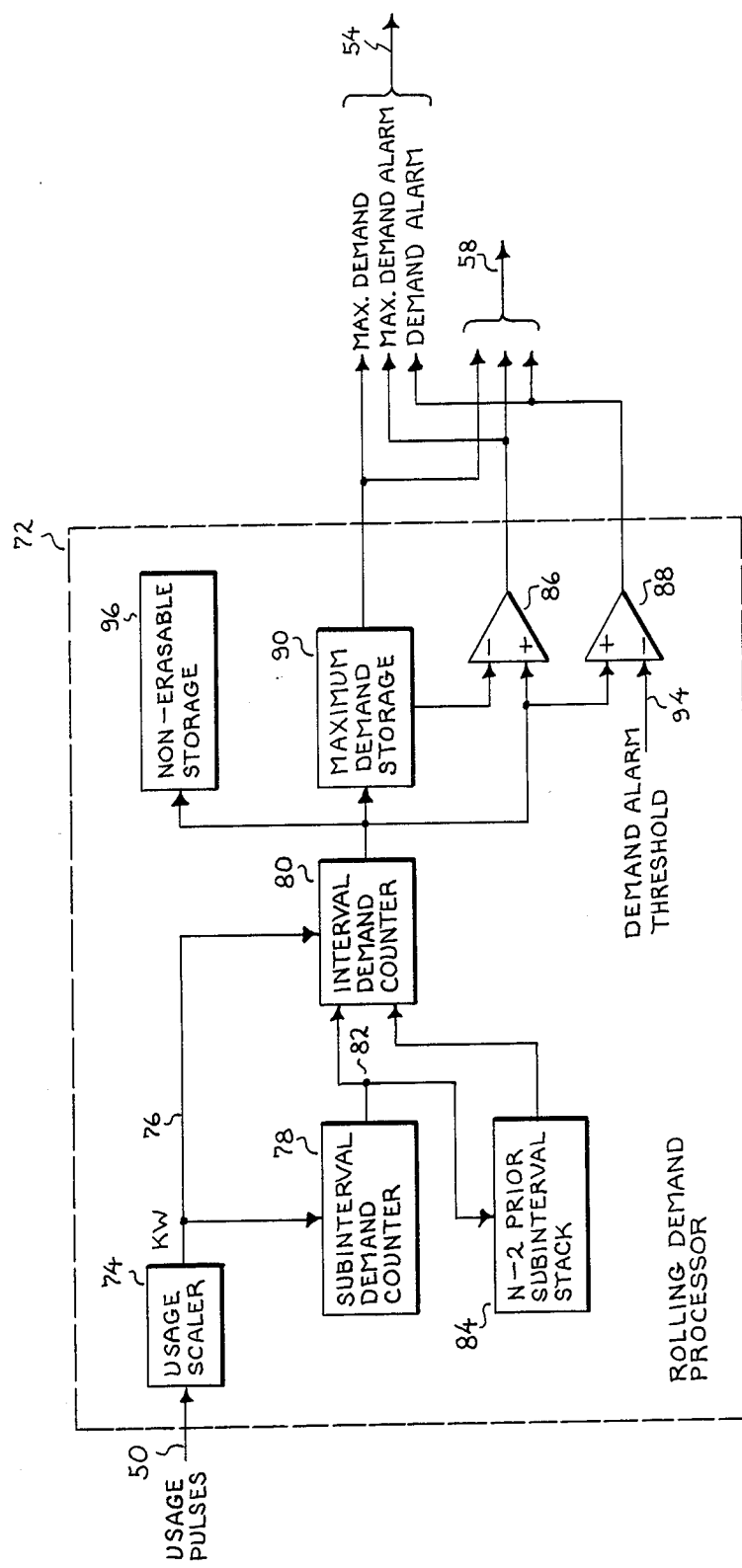
FIG. 5 is a functional block diagram of a rolling demand processor according to an embodiment of the invention.

Referring now to FIG. 5, a functional block diagram is shown of a rolling demand processor 72 according to an embodiment of the invention. Rolling demand processor 72 may be implemented in analog or digital circuits and may further be implemented in discrete or integrated components. In the preferred embodiment of the invention, the functions of rolling demand processor 72 are preferably performed in a digital processor and most preferably in a digital microprocessor of any convenient type.

Usage pulses on line 50 are applied to a usage scaler 74 which multiplies the usage pulses by a factor representing the number of kilowatts per pulse to produce a power usage signal KW which is applied on a line 76 to a subinterval demand counter 78 and an interval demand counter 80. A line 82 applies the content of subinterval demand counter 78 at the end of a subinterval to interval demand counter 80. In addition, line 82 also applies the content of subinterval demand counter 78 at the end of a subinterval to an N−2 prior subinterval stack 84 where the demand data from the oldest of the N−2 subintervals is discarded, and the demand data from the newly completed subinterval is stored. The relationship between power usage pulses and the number of kilowatts per pulse may be established by a programmed constant contained, for example, in non-volatile memory 64 and the value of the programmed constant may be supplied therefrom to usage scaler 74 by conventional control circuitry such as is conventionally found in digital microprocessors and/or their peripherals. By employing a programmed constant to relate power usage pulses to kilowatts per pulse, a single design of rolling demand processor 72 may be adapted to a wide range of meter styles and ratings by simply changing the programmed constant relating usage pulses to power used.

The content of interval demand counter 80 is continuously applied to non-inverting inputs of a maximum demand comparator 86 and a demand alarm threshold 88. A maximum demand stored in a maximum demand storage 90 is applied to an inverting input of maximum demand comparator 86. Whenever the demand recorded in the present interval in interval demand counter 80 exceeds the stored maximum demand in maximum demand storage 90, the output of maximum demand comparator 86 changes from low to high to thereby apply a maximum demand alarm signal on line 54 to display 56 to thereby provide an indication to the energy user that a new maximum demand is being set.

A demand alarm threshold voltage is applied on a line 94 to an inverting input of demand alarm threshold 88. Whenever the demand in the present interval exceeds the value of the demand alarm threshold voltage, a demand alarm is produced for application on line 54 to display 56 as well as for transmission on line 58 to, for example, alert the user that an alarm value has been reached in the present interval. The demand alarm threshold value may be set for any convenient alarm level beyond which may benefit a consumer by helping the consumer avoid large demand peaks. The demand alarm threshold value may be established slightly below a value which, if exceeded, would involve a significant upward adjustment in billing. When the consumer receives such an alarm, remedial action may be taken to reduce the consumption until the beginning of a new subinterval reduces the content of interval demand counter 80 sufficiently to remove the alarm signal.

For data security, it may be desirable to store certain data in a non-erasable storage 96. Such non-erasable storage 96 may include means for storing a cumulative demand consisting of the sum of all prior maximum demands existing each time maximum demand storage 90 is reset, either by authorized or unauthorized personnel. Alternatively, or in addition, non-erasable storage 96 may include means for storing a continuous cumulative demand which includes the sum of all maximum demands prior to the most recent reset plus the maximum demand accumulated since the most recent reset. Either or both of these values, which may be read out by techniques which would not be obvious to one attempting to tamper with the meter by, for example, performing unauthorized resets in an attempt to hide an expensive high demand reading, provides a check against which prior values may be compared to detect attempted tampering.

Referring now to FIGS. 6-10 a sequence of block diagrams is shown illustrating the manner in which subinterval demand counter 78, interval demand counter 80 and N−2 prior subinterval stack 84 cooperate with each other and the remainder of rolling demand processor 72 to achieve the objective of rolling demand recording with a minimum of storage and processing resources. For purposes of illustration and simplified description, FIGS. 6-10 omit connecting lines which are not relevant to the function being described. The following description covers operation in a current subinterval C, the operations performed at the end of current subinterval C and continued operation in the next subinterval C+1. Although a demand interval may be divided into any convenient number of subintervals, for concreteness, the following description assumes that a demand interval is divided into six equal demand subintervals (N=6). That is, for example, a demand interval may be 30 minutes and each of the six demand subintervals may be five minutes long.

Figures 6, 7:
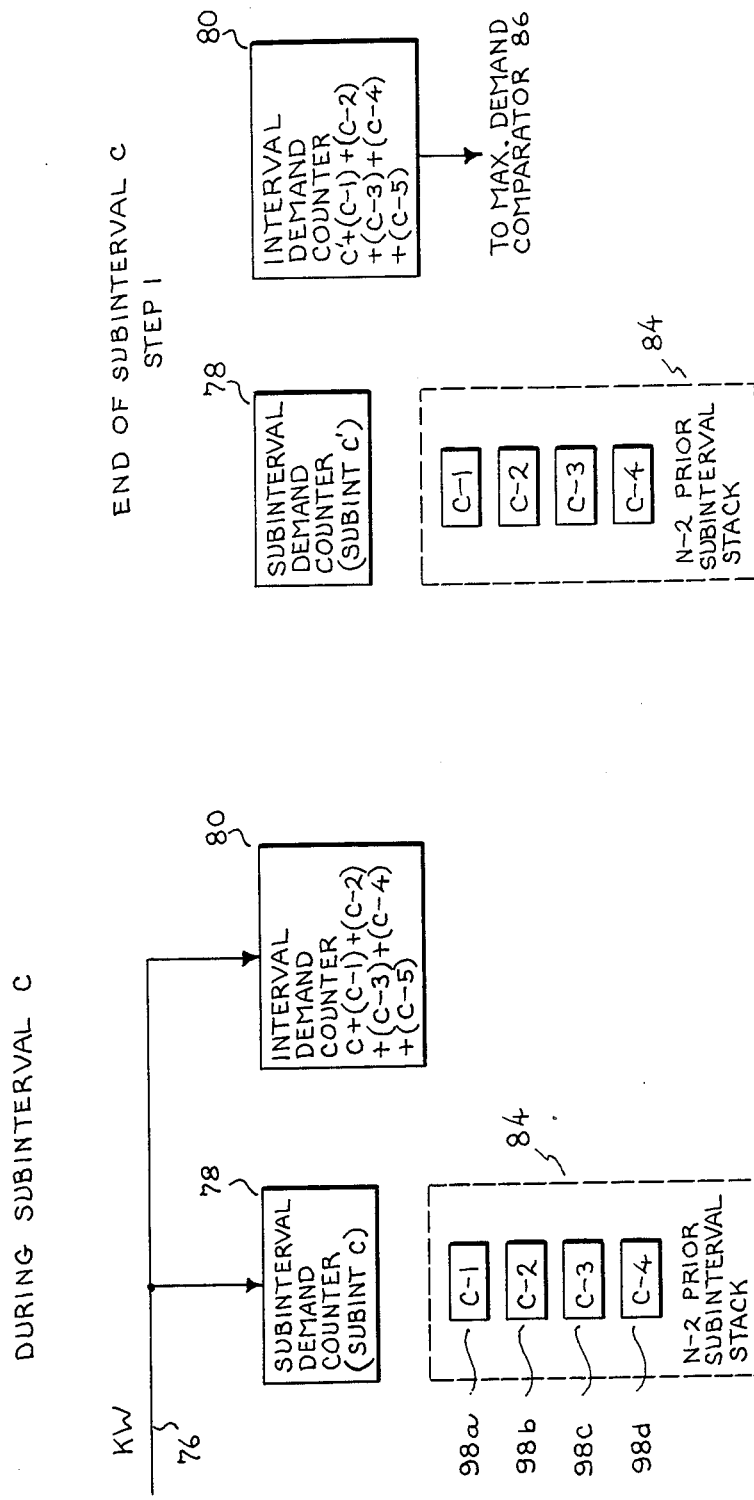
FIGS. 6-10 are simplified functional block diagrams illustrating the accumulation of rolling demand during one subinterval and the sequence of steps in preparation for accumulating demand in the following subinterval.

As shown in FIG. 6, N−2 prior subinterval stack 84 contains four storage elements 98a, 98b, 98c and 98d containing respectively the demands accumulated in the four prior subintervals C−1, C−2, C−3 and C−4. Subinterval demand counter 78 accumulates the power usage signal KW fed to it during subinterval C. In addition, interval demand counter 80 contains the sum of the demands in the prior five subintervals C−1, C−2, C−3, C−4 and C−5 and adds to this sum the incoming power usage signal KW to maintain an update of the interval demand throughout subinterval C.

FIG. 7 illustrates the first step at the end of subinterval C. At this time, subinterval demand counter 78 contains the total demand C' from completed subinterval C. The prime on C in FIG. 7 and succeeding figures indicates the demand from completed subinterval C. The subinterval demand C', summed with the demands from the prior five subintervals is compared to the stored maximum demand in maximum demand comparator 86 as previously described, and if its value is higher, it is copied into maximum demand storage 90 to replace the previously stored maximum demand.

Figure 8:
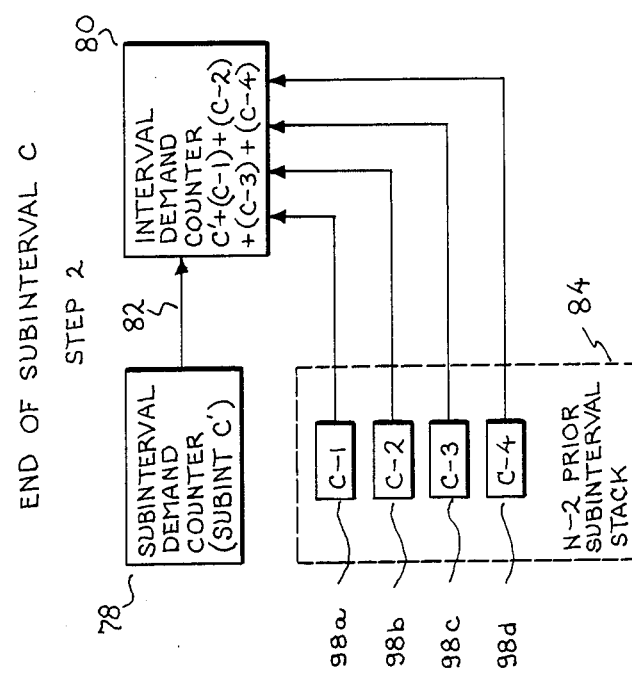

Step 2 at the end of subinterval C is shown in FIG. 8. Subinterval demand C' from subinterval demand counter 78 and the four demand values from N−2 prior subinterval stack 84 are applied to interval demand counter 80 where they are summed for subsequent use.

Figure 9:
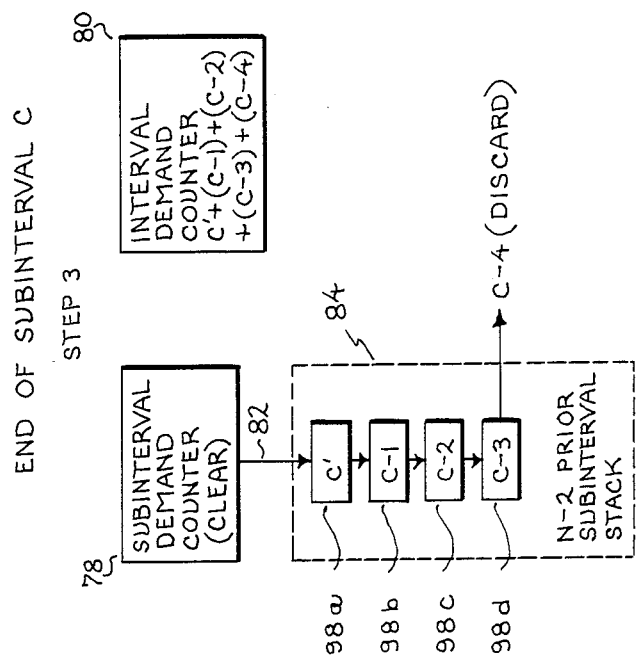

Step 3 at the end of subinterval C is shown in FIG. 9. The oldest demand value in N−2 prior subinterval stack 84, namely C−4, is discarded from storage element 98d and is replaced with the next oldest demand value C−3. Similarly, the other demand values are shifted down one storage element. Finally, the demand C' from just-completed subinterval C is shifted from subinterval demand counter 78 to storage element 98a and subinterval demand counter 78 is cleared.

Figure 10:
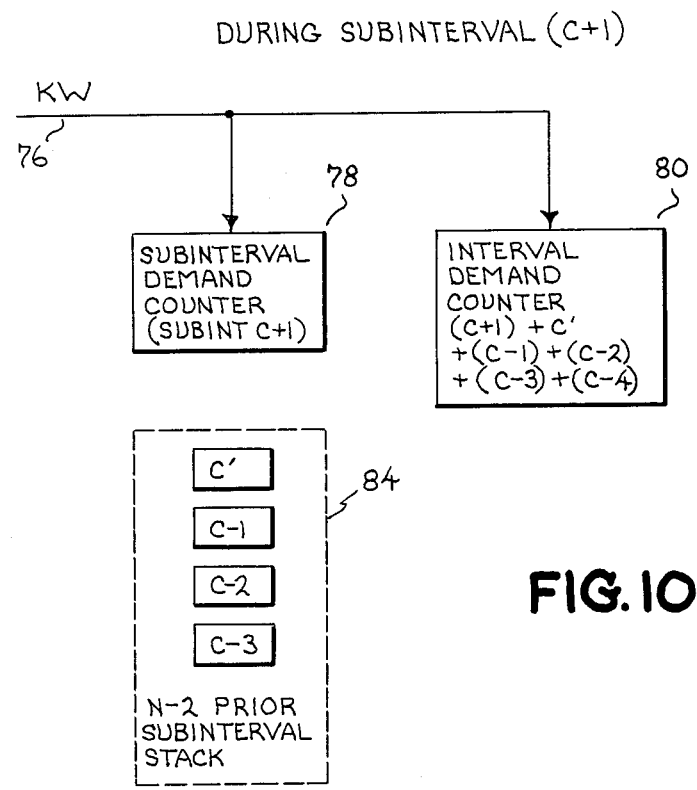

The three preceding steps prepare the apparatus for accumulating demand data in the next demand subinterval C+1 as shown in FIG. 10.

The preceding sequence is continued until interrupted by reset or test signals (not illustrated) which are more fully described in related U.S. patent application Ser. No. 599,735, filed on the same date as the present application, or by a power outage, the response to which is more fully disclosed in related U.S. patent application Ser. No. 599,743, the disclosures of which are herein incorporated by reference.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An electronic demand register for an electric meter comprising:
   means for defining a demand subinterval;
   means for defining a demand interval equal to an integral number N of said demand subintervals;
   means for summing a power usage data during each demand subinterval with a sum of demand data from N−1 prior demand subintervals to derive a rolling interval demand;
   means for storing a maxium demand;
   means for comparing said rolling interval demand with said maximum demand; and
   means for replacing said maximum demand with said rolling interval demand if said rolling interval demand exceeds said maximum demand whereby said means for storing a maximum demand remains updated with a maximum rolling interval demand in any preceding demand interval.

2. An electronic demand register according to claim 1 wherein said means for summing includes means for separately storing a demand in a current subinterval C and demands in N−2 prior contiguous subintervals, means effective at a beginning of a new subinterval C+1 for receiving a sum of said demand in an immediately preceding subinterval C with said demands in said N−2 prior contiguous subintervals whereby said means for receiving begins said new subinterval C+1 with a sum of demands from N−1 prior contiguous subintervals, and means for adding a power usage during said new subinterval C+1 with said sum of demands from N−1 prior contiguous subintervals to produce said rolling interval demand.

3. An electronic demand register according to claim 2 wherein said means for separately storing includes a stack of N−2 storage means, each of said N−2 storage means being effective to store a demand from one of said N−2 prior contiguous subintervals, and said means for storing a demand in said current subinterval C includes a subinterval demand counter, said subinterval demand counter including means for summing power usage data during said subinterval C.

4. An electronic demand register according to claim 1 wherein all of said means employ a digital processor.

5. An electronic demand register according to claim 4 wherein said digital processor includes a microprocessor.

6. An electronic demand register according to claim 1, further comprising means for producing an alarm when said rolling interval demand exceeds said maximum demand.

7. An electronic demand register according to claim 1 further comprising means for producing an alarm when said rolling interval demand exceeds a predetermined threshold value.

8. An electronic demand register according to claim 1 wherein said means for summing includes a usage scaler, said usage scaler including means for scaling energy usage pulses from said electric meter to derive a power usage value related to an actual power usage.

9. A method for registering for an electric meter comprising:
   defining a demand subinterval;
   defining a demand interval equal to an integral number N of said demand subintervals;
   summing a power usage data during each demand subinterval with a sum of demand data from $N-1$ prior demand subintervals to derive a rolling interval demand;
   storing a maximum demand;
   comparing said rolling interval demand with said maximum demand; and
   replacing said maximum demand with said rolling interval demand if said rolling interval demand exceeds said maximum demand whereby said maximum demand remains updated with a maximum rolling interval demand in any preceding demand interval.

* * * * *